United States Patent
Lim et al.

(10) Patent No.: US 8,647,966 B2
(45) Date of Patent: Feb. 11, 2014

(54) METHOD AND APPARATUS FOR DICING DIE ATTACH FILM ON A SEMICONDUCTOR WAFER

(75) Inventors: Ken Fei Lim, Taman Rasah Jaya (MY); You Chye How, Melaka (MY); Kooi Choon Ooi, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 159 days.

(21) Appl. No.: 13/157,196

(22) Filed: Jun. 9, 2011

(65) Prior Publication Data

US 2012/0313231 A1    Dec. 13, 2012

(51) Int. Cl.
*H01L 21/461*    (2006.01)

(52) U.S. Cl.
USPC ............... 438/460; 257/640; 438/33; 438/68; 438/113; 438/114; 438/462; 438/463; 438/464

(58) Field of Classification Search
USPC .............. 257/620; 438/33, 68, 113, 114, 460, 438/462, 463, 464
See application file for complete search history.

(56) References Cited

U.S. PATENT DOCUMENTS

| | | | | |
|---|---|---|---|---|
| 4,091,580 A * | 5/1978 | Oates | | 451/41 |
| 4,970,495 A * | 11/1990 | Matsumoto et al. | | 340/572.1 |
| 5,205,468 A * | 4/1993 | Budenbender | | 228/164 |
| 5,302,554 A * | 4/1994 | Kashiwa et al. | | 438/17 |
| 5,461,008 A * | 10/1995 | Sutherland et al. | | 83/15 |
| 5,872,396 A * | 2/1999 | Kosaki | | 257/712 |
| 5,880,522 A * | 3/1999 | Yonemoto et al. | | 257/666 |
| 5,972,154 A * | 10/1999 | Konya | | 156/268 |
| 5,998,238 A * | 12/1999 | Kosaki | | 438/114 |
| 6,358,115 B1 * | 3/2002 | Koike et al. | | 451/5 |
| 6,673,752 B2 * | 1/2004 | Bookbinder et al. | | 508/206 |
| 6,844,045 B2 * | 1/2005 | Komaki et al. | | 428/64.1 |
| 7,399,682 B2 * | 7/2008 | Yoshikawa et al. | | 438/463 |
| 7,768,141 B2 * | 8/2010 | Seo et al. | | 257/790 |
| 8,201,433 B2 * | 6/2012 | Kanie | | 72/335 |
| 8,211,781 B2 * | 7/2012 | Saito et al. | | 438/458 |
| 2001/0023973 A1 * | 9/2001 | Akram et al. | | 257/499 |
| 2002/0185713 A1 * | 12/2002 | Nakae | | 257/666 |
| 2002/0187729 A1 * | 12/2002 | Osugi et al. | | 451/28 |
| 2003/0134494 A1 * | 7/2003 | Ikehara | | 438/584 |
| 2003/0162313 A1 * | 8/2003 | Kim et al. | | 438/33 |
| 2005/0040519 A1 * | 2/2005 | Huang et al. | | 257/712 |
| 2006/0180579 A1 * | 8/2006 | Popescu et al. | | 219/121.18 |
| 2007/0082463 A1 * | 4/2007 | Bauer et al. | | 438/458 |
| 2007/0134890 A1 * | 6/2007 | Watanabe | | 438/462 |
| 2007/0187874 A1 * | 8/2007 | Daskal et al. | | 264/430 |

(Continued)

*Primary Examiner* — Cheung Lee
*Assistant Examiner* — William Harriston
(74) *Attorney, Agent, or Firm* — Eugene C. Conser; Wade J. Brady, III; Frederick J. Telecky, Jr.

(57) ABSTRACT

In one aspect of the present invention, a method of sawing a semiconductor wafer will be described. A semiconductor wafer is positioned in a wafer sawing apparatus that includes a sawing blade and a movable support structure that physically supports the semiconductor wafer. The semiconductor wafer is coupled with the support structure with various layers, including a die attach film, an adhesive and a base film. The die attach film is cut with the sawing blade. During the cutting operation, a contact portion of the sawing blade engages one of the layers and moves at least partly in one direction. While the contact portion of the sawing blade engages the layer, the support structure moves in the opposite direction. Various aspects of the present invention relate to arrangements and a wafer sawing apparatus that involve the aforementioned sawing method.

12 Claims, 7 Drawing Sheets

(56) References Cited

U.S. PATENT DOCUMENTS

| | | | |
|---|---|---|---|
| 2007/0240309 A1* | 10/2007 | Buswell et al. | 29/890.1 |
| 2007/0249145 A1* | 10/2007 | Nakamura | 438/464 |
| 2009/0057845 A1* | 3/2009 | Hong et al. | 257/621 |
| 2009/0091044 A1* | 4/2009 | Seo et al. | 257/790 |
| 2009/0189258 A1* | 7/2009 | Mariani et al. | 257/632 |
| 2009/0294043 A1* | 12/2009 | Aihara et al. | 156/250 |
| 2010/0015329 A1* | 1/2010 | Nguyen et al. | 427/96.2 |
| 2010/0207252 A1* | 8/2010 | Yoshimura et al. | 257/620 |
| 2010/0289158 A1* | 11/2010 | Hong et al. | 257/783 |
| 2011/0057332 A1* | 3/2011 | Iwami | 257/783 |
| 2011/0133365 A1* | 6/2011 | Ushimaru et al. | 264/400 |
| 2012/0056309 A1* | 3/2012 | Kim | 257/620 |
| 2012/0068312 A1* | 3/2012 | Tanaka et al. | 257/620 |
| 2012/0092810 A1* | 4/2012 | Chiu et al. | 361/535 |

\* cited by examiner

FIG. 5

METHOD AND APPARATUS FOR DICING DIE ATTACH FILM ON A SEMICONDUCTOR WAFER

FIELD OF THE INVENTION

The present invention relates to integrated circuit packages. More specifically, the present invention relates to methods and arrangements for dicing die attach film on a semiconductor wafer.

BACKGROUND OF THE INVENTION

Figure 1A:
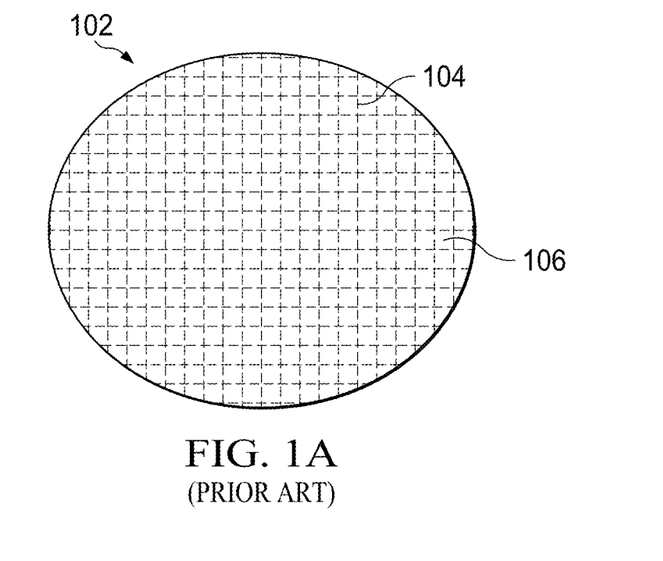
FIG. 1A is a diagrammatic top view of an example semiconductor wafer.

There are a wide variety of ways to form integrated circuits. One conventional approach involves forming various devices and interconnects on a slice of semiconductor material. These operations form multiple copies of the same integrated circuit design on a single semiconductor wafer. FIG. 1A is a diagrammatic top view of an example semiconductor wafer 102 that includes multiple integrated circuits 106.

Figure 1B:
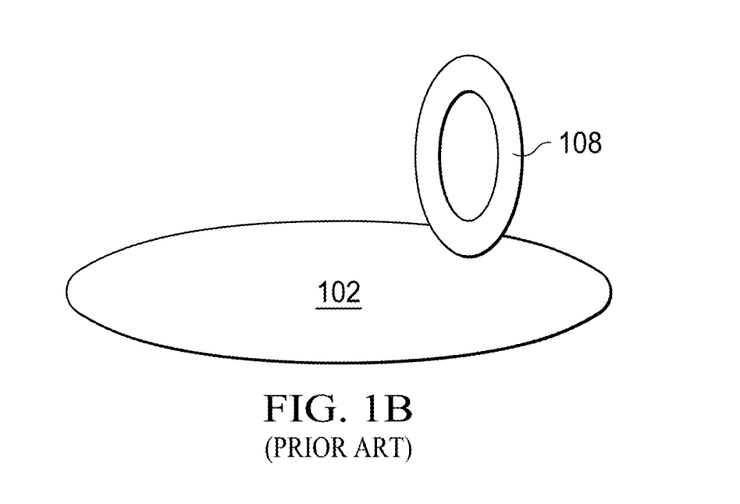
FIG. 1B is a diagrammatic perspective view of an example semiconductor wafer and a sawing blade.

The semiconductor wafer is then diced or sawed to separate the integrated circuits. FIG. 1B is a diagrammatic perspective view of a sawing blade 108 that is positioned next to the wafer 102. The sawing blade 108 makes linear cuts along the saw streets 104, which are represented by dotted lines in FIG. 1A. The cuts are arranged to form a grid-like pattern on the wafer.

Figure 1C:
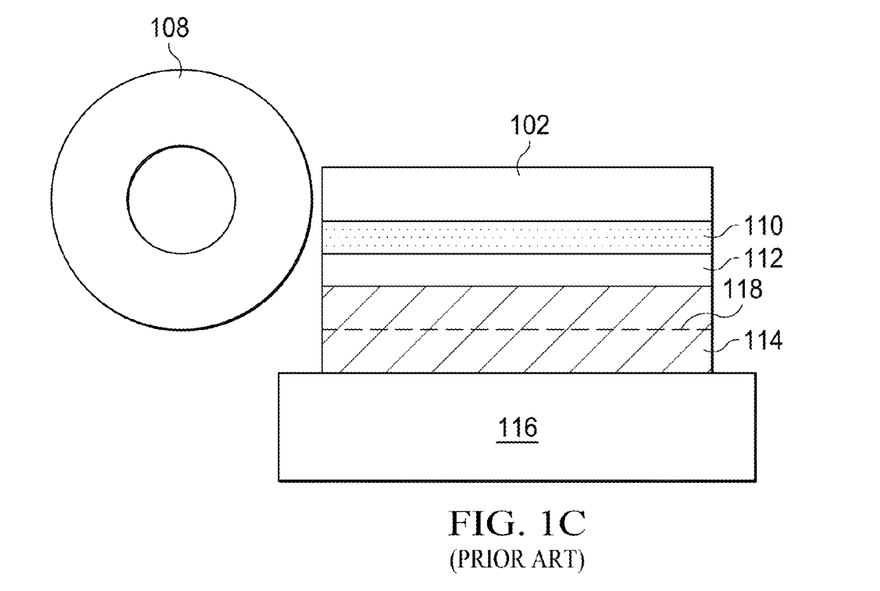
FIGS. 1C and 2A are diagrammatic side views of an example sawing blade and a semiconductor wafer that is coupled with a chuck table using a die attach film, adhesive and a base film.

Referring next to FIG. 1C, various components for supporting and dicing the wafer are shown. FIG. 1C is a side view of the semiconductor wafer 102, a movable chuck table 116 for supporting the wafer and a sawing blade 108 for dicing the wafer 102. The bottom surface of the wafer 102 is adhered to a die attach film 110. The die attach film in turn is coupled with a base film 114 using an adhesive 112. The base film 114 is positioned on a top surface of the movable chuck table 116.

During a cutting operation, the sawing blade 108 spins at high speeds and the chuck table 116 moves the wafer 102 and its underlying layers towards the sawing blade 108. The sawing blade 108 then proceeds to cut through the wafer 102, the die attach film 110 and the adhesive 112. The sawing blade 108 also cuts into but not entirely through the base film 114, so that the base film 114 can help hold the dice together during the cutting operation. This process is repeated multiple times to cut the wafer along the saw streets 104 illustrated in FIG. 1A.

Once all of the cutting operations are completed, each die 106 is lifted off of the base film 114 and positioned onto a suitable substrate or lead frame. The die attach film is carried together with the die 106 and helps adhere the die 106 to its underlying substrate. In some implementations, the die 106 is then electrically connected to the substrate and encapsulated in molding material to form an integrated circuit package.

While existing arrangements and methods for dicing semiconductor wafers and die attach film work well, there are continuing efforts to further improve the effectiveness of such techniques.

SUMMARY OF THE INVENTION

In one aspect of the present invention, a method of sawing a semiconductor wafer will be described. A semiconductor wafer is positioned in a wafer sawing apparatus that includes a sawing blade and a movable support structure that physically supports the semiconductor wafer. The semiconductor wafer is coupled with the support structure with various layers, including a die attach film, an adhesive and a base film. The die attach film is cut with the sawing blade. During the cutting operation, a contact portion of the sawing blade engages one of the layers and moves at least partly in one direction. While the contact portion of the sawing blade engages the layer, the support structure moves in the opposite direction.

Various embodiments of the present invention involve a cutting operation that cuts the die attach film without pulling the die attach film towards the base film. In some implementations, the cutting operation pulls the die attach film upwards away from the base film and towards the overlying semiconductor wafer. As a result, the die attach film is not anchored or embedded in the base film and the die can be removed easily from the base film.

In another aspect of the present invention, an arrangement for packaging an integrated circuit will be described. The arrangement includes a lead frame with a die attach pad and a plurality of leads. An integrated circuit is adhered to the die attach pad with a die attach film. The die attach film covers the bottom surface of the integrated circuit die and also extends around the edge of the die and upward to cover a side surface of the die. This protrusion of the die attach film over the side surface of the die may be formed using the aforementioned cutting operation.

Another aspect of the present invention relates to a wafer sawing apparatus that includes a movable support structure, a sawing blade, a processor and a memory. The movable support structure is arranged to physically support a semiconductor wafer. The sawing blade is positioned near the movable support structure and is arranged to cut the semiconductor wafer as well as the layers (e.g., die attach film, adhesive and/or base film) that underlie the wafer. The memory stores computer readable instructions, which when executed by the processor, cause the wafer sawing apparatus to perform one or more steps of the aforementioned method.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention generally relates to methods and arrangements for dicing a semiconductor wafer. More specifically, various embodiments of the present invention relate to a method of dicing die attach film that is on a backside of a semiconductor wafer.

Figure 2A:
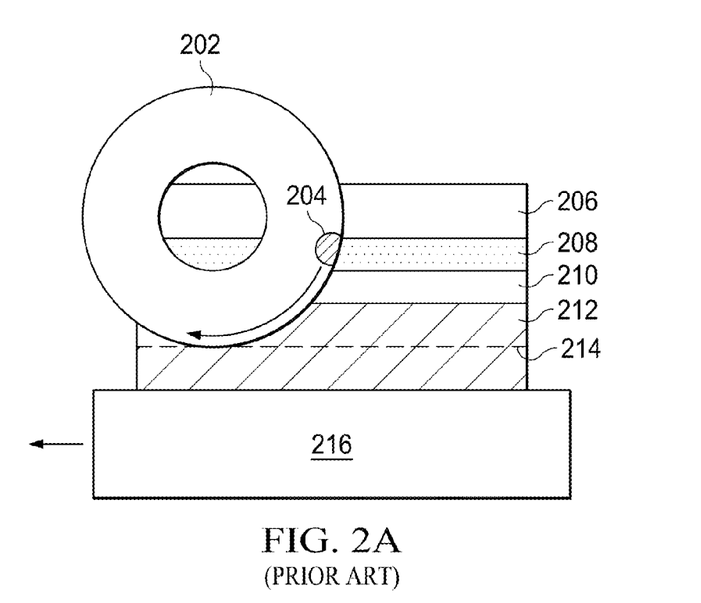

Conventional dicing techniques, although effective for many applications, can cause problems when utilized to cut through die attach film. An example of this problem is illustrated in FIG. 2A, which is a diagrammatic side view of the semiconductor wafer 202 positioned on a chuck table 216. A die attach film 208 is attached to the bottom surface of the wafer 202. A base film 212 is positioned on a top surface of the chuck table 216. The adhesive 210 is sandwiched between the die attach film 208 and the base film 214 and helps to bond the two together. In the illustrated example, the sawing blade 204 is spinning in a clockwise direction and the support structure 216 is moving in a leftward direction. The spinning sawing blade 202 is positioned to cut through the wafer 206, the die attach film 208, the adhesive 210 and a portion of the base film 212 up to a depth 214 indicated by the dotted line.

The relative movements of the sawing blade 202 and the chuck table 216 can play important roles in the dicing process. In the illustrated example, it should be noted that a portion 204 of the sawing blade 202 that engages the die attach film 208 is moving at least partially in the same direction (e.g., leftward in FIG. 2A) as the chuck table 216. To the best knowledge of the inventors, this approach to cutting die attach film, which is a referred to as a "forward step cut," is a standard practice in the semiconductor industry.

Figure 2B:
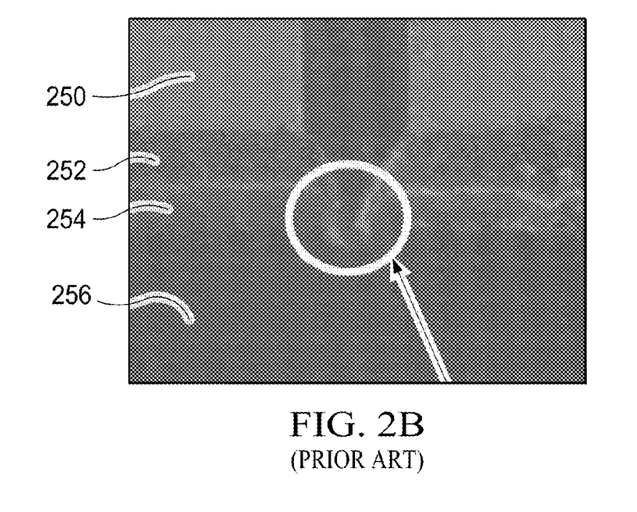
FIG. 2B is a side view of an example die and die attach film that have been cut using a conventional forward step cut technique.

A problem with this approach, however, is that it tends to drive or pull a portion of the die attach film 208 into the base film 212. Examples of this problem are shown in FIG. 2B, which is a magnified image of dice 250, die attach film 252, adhesive 254 and base film 256 after a conventional forward step cutting process. A review of the photographs reveals how the die attach film 252 is bent downward and penetrates through the adhesive 254 to come in contact with the base film 256.

The anchoring of the die attach film in the base film can cause various problems. Ideally, the singulated dice, which are covered with the die attach film, are pulled easily from the base film and later positioned on a suitable substrate or lead frame. If the die attach film is embedded in the base film, however, the die and its die attach film may resist being removed from the base film. Efforts to remove the die may cause the die attach film to peel away from the die or damage adjacent dice. This results in a higher number of defective dice.

Various implementations of the present invention address one or more of the above problems. Referring next to FIG. 3 and FIGS. 4A-4H, an improved method for cutting the die attach film on a semiconductor wafer according to a particular embodiment of the present invention will be described. In the illustrated method, the relative movements of the sawing blade and the chuck table differ from that of the forward step cut approach such that the die attach film is not driven or pulled into the base film. As a result, yield rates may be improved and the singulated dice may be more easily removed from the base film.

Figure 4A:
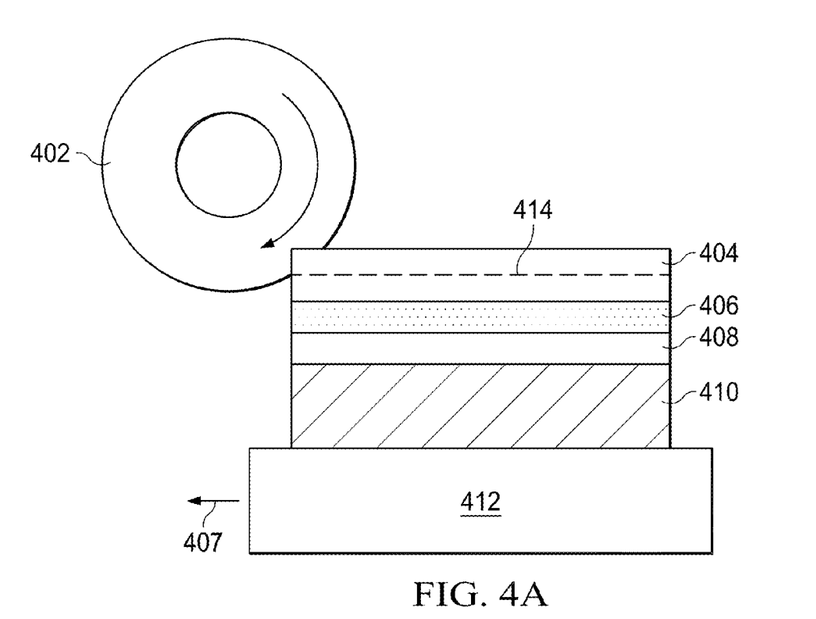
FIGS. 4A-4D are diagrammatic side views of various steps in the method illustrated in FIG. 3.

Initially, at step 302 a semiconductor wafer 404 is positioned in a wafer sawing apparatus. FIG. 4A is a diagrammatic side view of a semiconductor wafer 404 and various components of a wafer sawing apparatus according to a particular embodiment of the present invention. The wafer sawing apparatus includes a support structure 412 (e.g., a chuck table) for physically supporting the semiconductor wafer 404 and a sawing blade 402 for cutting the wafer 404. The bottom surface of the wafer 404 is covered with a die attach film 406. The top surface of the support structure is covered with the base film 410. The base film 410 and the die attach film 406 are bonded together using the adhesive 408.

The die attach film 406, the adhesive 408 and the base film 410 may be made of any materials and have any dimensions that are known to persons of ordinary skill in the art. The die attach film 406, for example, may be any film that is applied to a surface of the wafer before singulation and that is suitable for adhering the die to a suitable substrate or lead frame after singulation. Polymer, glass and metallic alloys work well as materials for the die attach film. The adhesive 408 may be made of any material that helps secure the base film 410 to the die attach film 406. In some embodiments, the adhesive 408 is an adhesive coating or surface on either the base film, the die attach film or both. Each of the die attach film 406, the adhesive 408 and the base film 410 may have a uniform composition or include mixtures or sublayers of different materials. In various embodiments, the base film 410 and die attach film 406 are preformed sheets with substantially uniform thicknesses that are laid onto the semiconductor wafer 404 and the support structure 412, respectively.

Afterward, optional preliminary cuts may be made in the semiconductor wafer 404 (step 304 and FIG. 4A). Such preliminary cuts, which generally penetrate only partially through the wafer, may be performed using any suitable technique. In the illustrated embodiment, for example, a forward step cut is used. That is, the sawing blade 402 is spinning such that a portion of the sawing blade 402 that is engaging the wafer 404 is moving at least partly in the same direction 407 as the support structure 412. The movement of the support structure 412 pushes the wafer against the spinning sawing blade to form a linear saw street of a depth 414 in the wafer. Some implementations involve a cut whose depth is approximately between 60% and 80% of thickness of the wafer. In various embodiments, the sawing blade 402 is substantially wider and is different from the sawing blade used in step 306 of FIG. 4A. Such preliminary cuts can help reduce undesirable cracking in the semiconductor wafer during the dicing process.

Figure 3:
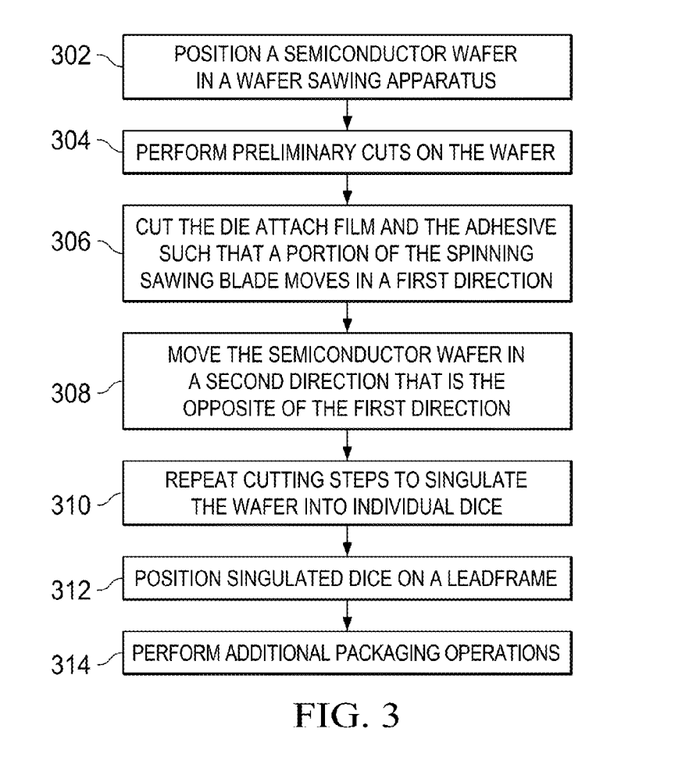
FIG. 3 is a flow chart that describes a method for cutting die attach film according to a particular embodiment of the present invention.
Figure 4B:
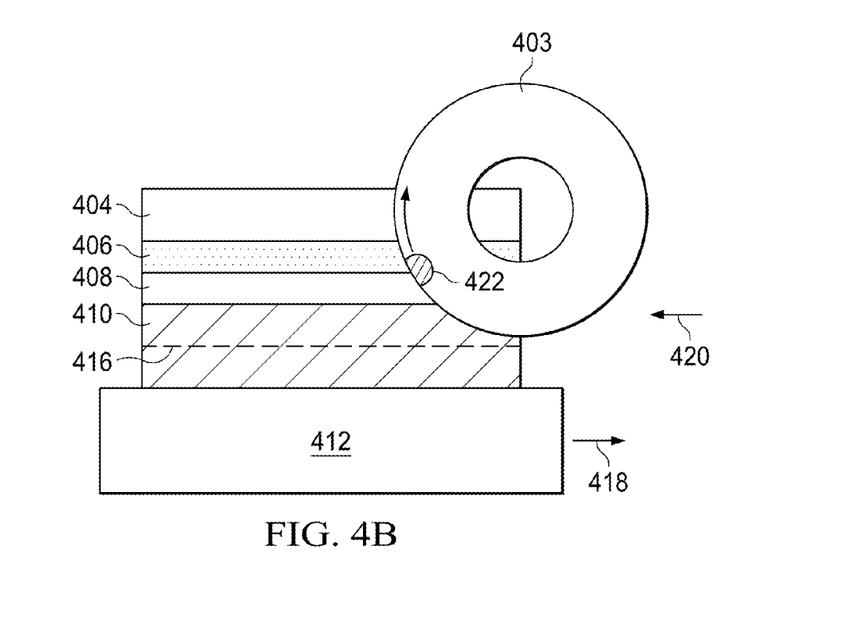

At step 306 and FIG. 4B, a sawing blade 403 is used to cut through the semiconductor wafer 404, the die attach film 406 and the adhesive 408 using a modified "reverse step cut" technique. In the illustrated embodiment, the sawing blade 403 is positioned so that its bottom edge will extend at least partially into the base film 410 (e.g., up to the depth 416 indicated by the dotted line in the figure.) The movement of the support structure 412 positions the stacked layers against the spinning sawing blade 403 (step 308 of FIG. 3.) As a result, the sawing blade 403 cuts multiple layers, including the die attach film 406, the adhesive 408 and/or the base film 410.

The modified "reverse step cut" technique involves coordinating the movement of the support structure and the sawing blade so that a portion of the sawing blade that engages one of the connecting layers (i.e., the die attach film 406, the adhesive 408 and the base film 410) is moving in the opposite direction of the support structure 412. In the illustrated embodiment, for example, a contact portion 422 of the sawing blade 403 engages the die attach film 406. Because of the spin and positioning of the sawing blade 403, the contact portion 422 of the sawing blade 403 is moving at least partly in a direction 420 when it engages the die attach film 406. (In the figure, the direction 420 is shown as a horizontal leftward direction, although the motion of the contact portion 422 of the sawing blade 403 may have a vertical component as well.) While the contact portion 422 is engaging the die attach film 406, the support structure 412, which physically supports and carries the wafer 404, die attach film 406, adhesive 408 and the base film 410, is moving in a direction 418, which is the opposite of the direction 420. Although the above example involves a contact portion 422 that engages the die attach film 406, in other embodiments the contact portion 422 engages the base film 410 and/or the adhesive 408 in the described manner.

Some implementations involve a reverse step cut technique in which the sawing blade 403 tends to pull the die attach film 406 upwards rather than downwards. By contrast, as discussed earlier, a conventional forward step cut approach tends to pull the die attach film downward and towards the base film. In various embodiments of the present invention, when the contact portion 422 of the sawing blade 403 engages and cuts into the die attach film 406, it is moving at least in part towards the overlying semiconductor wafer 404 and away from the underlying base film 410 and the support structure 412.

The inventors have determined that the use of a reverse step cut technique in this manner tends to avoid the problems discussed in connection with FIG. 2A. To the best knowledge of the inventors, a standard practice in the semiconductor industry is to cut die attach using a forward step cut technique. This technique, however, can push and/or anchor the die attach film into the base film, which can make the dice more difficult to remove and increase the number of defects. The aforementioned reverse step cut technique helps avoid these problems by greatly reducing or eliminating the pulling of the die attach film towards the base film.

The sawing blade 403 used in the reverse step cut technique may be any cutting instrument known in the art for cutting semiconductor wafers and/or die attach film. In the illustrated embodiment, for example, the sawing blade 403 is circular, spins on its central axis and/or remains substantially stationary during the cutting process, although these are not requirements. In various embodiments, the sawing blade 403 used in step 306 may be distinct from and substantially thinner than the sawing blade 402 used in step 304. Some approaches involve the use of a diamond sawing blade.

The support structure 412 may be any suitable structure (e.g., a chuck table) that is arranged to physically support and carry a semiconductor wafer and its underlying layers. Generally, the support structure is arranged to move linearly towards the stationary sawing blade so that the sawing blade engages and cuts through portions of the wafer stack.

The reverse step cut technique may be modified in a wide variety of ways, depending on the needs of a particular application. In the illustrated embodiment, for example, the reverse step cut techniques involves positioning the sawing blade 403 so that it engages and cuts the semiconductor wafer 404, the adhesive 408 and the base film 410 in addition to the die attach film 406. Some implementations, however, involve a reverse step cut technique that cuts fewer or more layers. The degree to which the sawing blade 403 cuts into the base film 410 may vary. A cutting depth of approximately between 10% and 20% of the thickness of the base film works well for various applications. Since the base film 410 it is not entirely penetrated by the sawing blade 403, it serves to help hold the dice together during the cutting process.

Figure 4C:
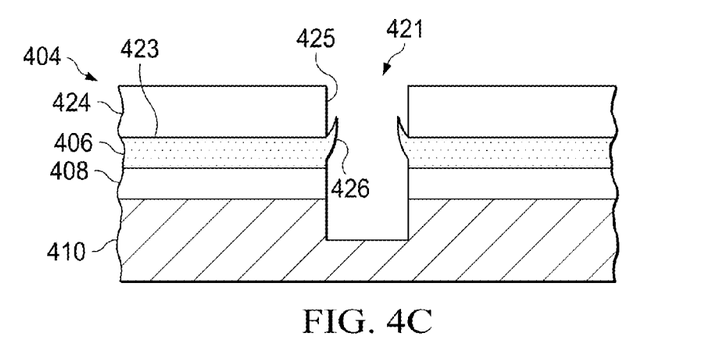

The reverse step cut technique may be repeated multiple times as appropriate to singulate the integrated circuit dice in the wafer 404 (step 310 of FIG. 3 and FIG. 4C). This approach can exert an upward pulling force that affects the shape of the die attach film. By way of example, FIG. 4C is a diagrammatic side view of a portion of a wafer 404 that has been singulated using the reverse step cut technique. A saw street 421, which was formed by the sawing blade in step 306, extends entirely through the wafer 424, the die attach film 406 and the adhesive 410 and partially into the base film 410. In this example, the cutting process tended to pull the die attach film 406 away from the underlying base film 410 and towards the overlying wafer 424. Thus, the die attach film 406 has been repositioned and/or pulled upward such that it extends beyond and around an edge of the bottom surface 423 of the die 424 to cover a side surface 425 of the die 424. A protruding portion 426 of the die attach film 406 extends into the saw street 421. In some cases, the protruding portion 426 of the die attach film 406 may have been formed through an upward repositioning of the die attach film that used to be in the saw street region. Although the present invention does not require the formation of such protruding features, various implementations of the reverse step cut technique tend to affect the shape of the die attach film in this manner.

Figure 4D:
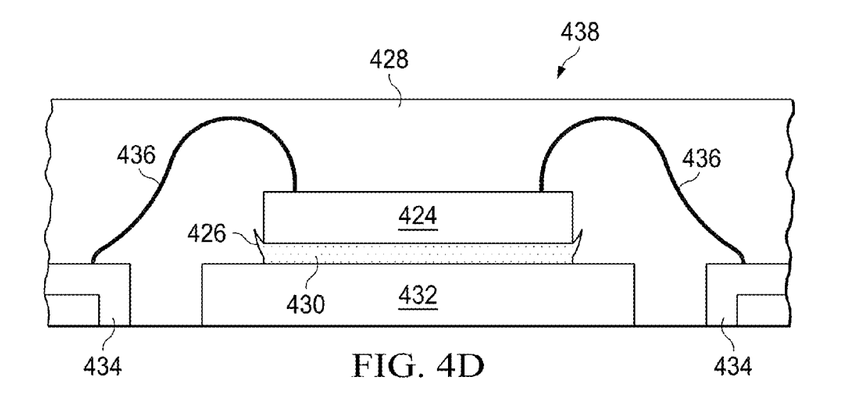

At step 312 of FIG. 3 and FIG. 4D, the singulated integrated circuit dice 424 (and their underlying die attach film 430) are then removed from the support structure and positioned on a suitable substrate (e.g., a lead frame.) Any suitable lead frame or electronic substrate design that is known in the art may be used in this step. In the illustrated embodiment, for example, the substrate is a lead frame panel with multiple device areas. Each device area includes multiple leads 434 and a die attach pad 432. At least one integrated circuit die 424 is secured to the die attach pad 432 using the die attach film 426. Due to the die attach film 426, which is a diced portion of the die attach film 406 of FIG. 4B, it is not necessary to deposit additional adhesive on the die attach pad 432 to attach the die 424.

Figure 4E:
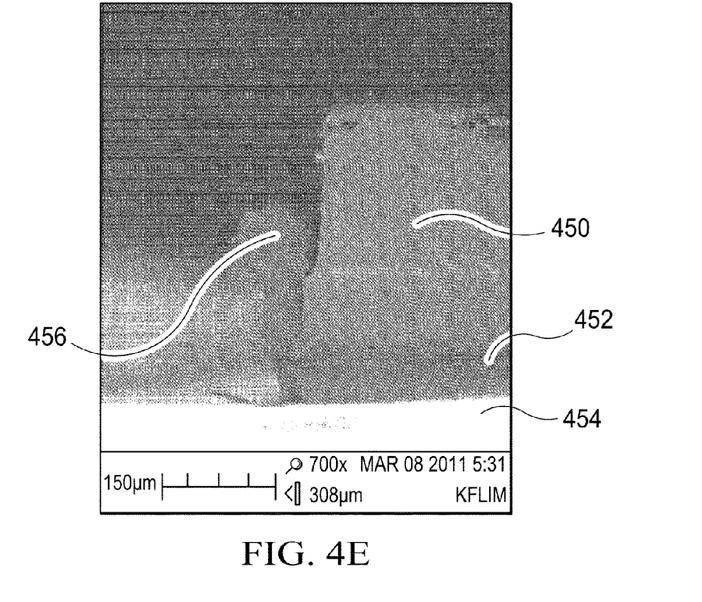
FIG. 4E is a side view of an example die, die attach film and die attach pad where the die attach film has been cut according to a particular embodiment of the present invention.

After the integrated circuit die 424 and its underlying die attach film 426 are positioned on the die attach pad 432, the protruding portions 426 of the die attach film 430 may remain. An example of this feature is shown in FIG. 4E. FIG. 4E is a photograph of an example integrated circuit die 450 on a die attach 454 pad according to a particular embodiment of the present invention. The die 450 is secured to the die attach pad 454 with a die attach film 452. It should be appreciated that the shape of the die attach film 452 reflects the way in which the die attach film was cut. That is, since the die attach film 452 was cut using the aforementioned reverse step cut technique, the die attach film 452 covers the bottom surface of the die and also includes a protruding portion 456 that extends upward to cover a side surface of the die 450, as described earlier. A review of the image reveals that the protruding portion 456 can extend upward a substantial distance. In some implementations, the portion of the die attach film that overlies the side surface of the die can extend vertically at least 10%, 20%, 30% or 50% of the height (or thickness) of the die. In still other implementations, the protruding portion 456 is in direct contact with a side surface of the dice.

Figure 4F:
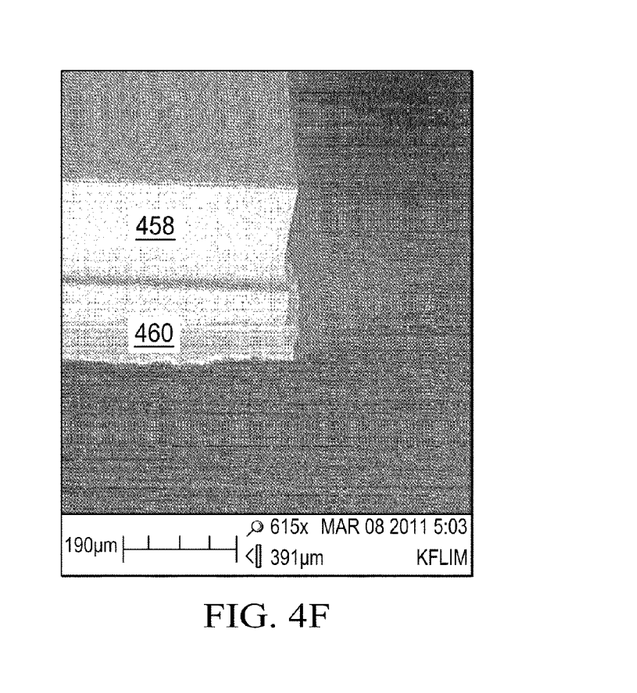
FIG. 4F is a side view of an example die, die attach film and die attach pad where the die attach film has been cut using a conventional forward step cut technique.

By way of comparison, FIG. 4F is a photograph of a die 458 whose die attach film 460 was cut using a conventional forward step cut technique. It should be noted that the die attach film 460 in this image covers only the bottom surface of the die and does not cover a side surface of the die 458.

Figure 4G:
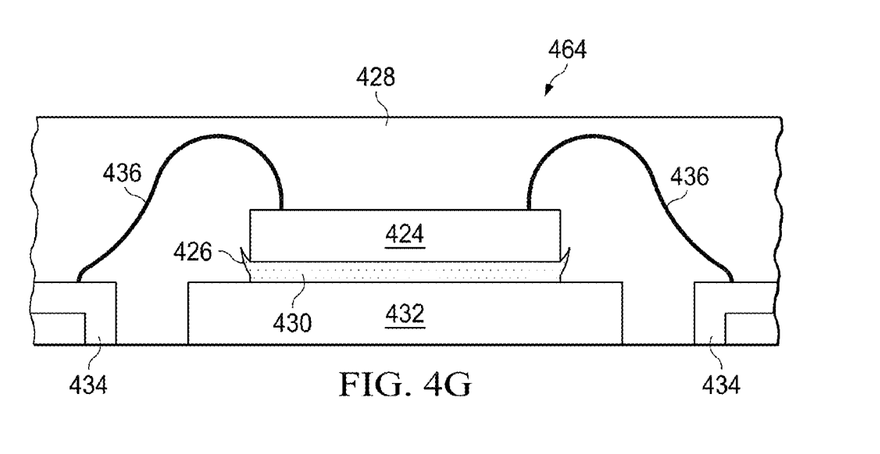
FIG. 4G is an integrated circuit package according to a particular embodiment of the present invention.

After the dice have been positioned on a substrate, additional packaging operations may be performed (step 314 of FIG. 3 and FIG. 4D). In the illustrated embodiment, for example, each die is electrically connected (e.g., using wire bonds 436) to leads 434 of its corresponding device area. Afterward, molding material 428 is applied to encapsulate portions of the substrate and the integrated circuit dice 424 substantially simultaneously to form a molded structure 438. The molded structure 438 is then singulated to form multiple integrated circuit packages. An example of one such package is shown in FIG. 4G. FIG. 4G is a diagrammatic side view of an integrated circuit package 464 including a die 424, a die attach film 430, a die attach pad 432 and multiple leads 434. The die attach film 430 helps adhere the die 424 to the die attach pad 432 and the die 434 is electrically connected to at least one of the leads 434. The leads 434 are partially exposed on the exterior of the package to serve as electrical contacts for the integrated circuit package. The die attach film 430 continues to have the protruding portions 426 that were described earlier in connection with FIGS. 4C, 4D, 4E and 4F. It should be noted that the aforementioned dicing techniques may be utilized in connection with a wide variety of package designs, of which the design in FIG. 4G is but one example.

Figure 5:
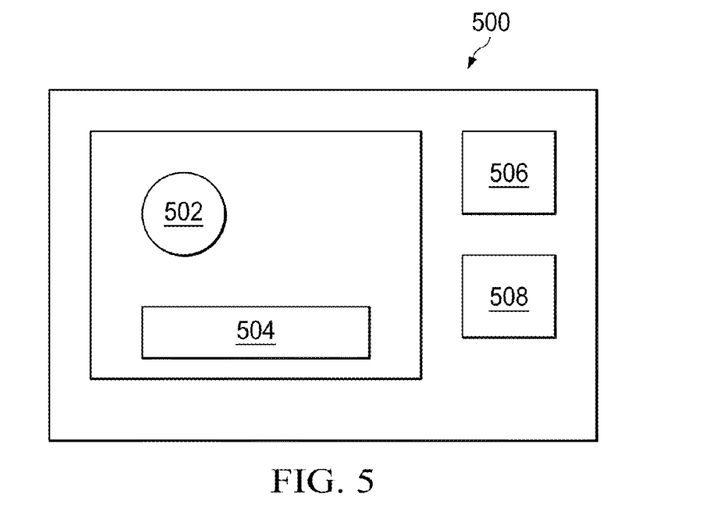
FIG. 5 is a wafer sawing apparatus according to a particular embodiment of the present invention.

Referring next to FIG. 5, a wafer sawing apparatus 500 according to a particular embodiment of the present invention will be described. The wafer sawing apparatus 500 includes a movable support structure 504, a sawing blade 502, a processor 506 and memory 508. The movable support structure 504 is arranged to physically support a semiconductor wafer. The sawing blade 502 is positioned over the support structure and is arranged to cut through the semiconductor wafer and any of its underlying layers (e.g., die attach film, adhesive and base film.) The memory 508 is arranged to store computer readable instructions that, when executed by the processor 506, cause the wafer sawing apparatus 500 to perform the methods described in connection with FIG. 3.

Although only a few embodiments of the invention have been described in detail, it should be appreciated that the invention may be implemented in many other forms without departing from the spirit or scope of the invention. The method of FIG. 3 includes various steps, but it should be appreciated that one or more of these steps may be removed or modified in various ways to suit the needs of particular applications. For example, the preliminary cuts (step 304) may or may not be performed. The preliminary cuts of step 304 may involve cutting partially through the semiconductor wafer and/or other types of cuts as well. Although the specification describes a preferred embodiment in which a portion of the wafer, the die attach film, the adhesive and a portion of the base film are cut using step 306, more or fewer of these layers may be cut instead. In the foregoing description, many of the described lead frames include leads and/or contacts. In the context of this invention, the term lead is intended to encompass leads, contacts and other electrical interconnect structures that may be present within a lead frame. Therefore, the present embodiments should be considered as illustrative and not restrictive and the invention is not limited to the details given herein, but may be modified within the scope and equivalents of the appended claims.

What is claimed is:

1. A method of sawing a semiconductor wafer, comprising:
positioning a semiconductor wafer in a wafer sawing apparatus that includes a first sawing blade and a movable support structure that physically supports the semiconductor wafer, wherein the semiconductor wafer is coupled with the support structure using a plurality of connecting layers including a die attach film, an adhesive and a base film;
cutting the die attach film with the first sawing blade, wherein during the cutting operation a contact portion of the first sawing blade engages one of the connecting layers and is moving at least partly in a first direction;
while the contact portion of the sawing blade engages the one of the connecting layers, moving the support structure in a second direction, wherein the second direction is the opposite of the first direction;
singulating the semiconductor wafer using the cutting operation to form a multiplicity of integrated circuit dice, each integrated circuit die having a top surface, an opposing bottom surface and side surfaces, the bottom surface of each integrated circuit die being covered with a die attach film;
wherein the cutting operation causes the die attach film that covers one of the dice to extend beyond and around an edge of the bottom surface of the die to also cover a side surface of the one of the integrated circuit dice; and
further wherein:
the semiconductor wafer includes a multiplicity of integrated circuit dice including a first integrated circuit die and a second integrated circuit die;
the die attach film includes first and second portions, which underlie respectively the first and second dice;
the cutting of the die attach film forms a saw street between the first and second integrated circuit dice and between the first and second portions of die attach film; and
the cutting of the die attach film causes the first portion of the die attach film to extend beyond the bottom surface of the first die and into the saw street, wherein the first portion of the die attach film also bends around an edge of the bottom surface of the first die to cover a side surface of the first die.

2. A method as recited in claim 1, wherein the cutting of the die attach film does not involve pulling the die attach film towards the base film.

3. A method as recited in claim 1, wherein the cutting of the die attach film involves pulling a portion of the die attach film away from the base film and towards the semiconductor wafer.

4. A method as recited in claim 1 further comprising:
positioning a first die of the singulated dice on a device area of a substrate, wherein the die attach film underlying the first die helps adhere the first die to the substrate;
electrically connecting the first die to the substrate; and
encapsulating portions of the substrate and the die to form an integrated circuit package.

5. A method as recited in claim 4 wherein:
the substrate is a lead frame panel including a multiplicity of device areas;
the method further comprises positioning the multiplicity of integrated circuit dice on the device areas of the lead frame panel;
electrically connecting the multiplicity of integrated circuit dice to the lead frame panel;
encapsulating portions of the lead frame panel and the integrated circuit dice to form a molded panel; and
singulating the molded panel to form a multiplicity of integrated circuit packages, each integrated circuit package including at least one of the integrated circuit dice.

6. A method as recited in claim 1 further comprising cutting partially through the semiconductor wafer using a second sawing blade wherein:

the second sawing blade is substantially wider than the first sawing blade;

the partial cutting of the semiconductor wafer is performed before the cutting of the die attach film;

the partial cutting of the semiconductor wafer involves cutting approximately between 10 and 20% of the thickness of the wafer; and the cutting of the die attach film involves extending and continuing the cuts made by the second cutting blade.

7. A method as recited in claim 1 wherein the cutting operation involves cutting entirely through the die attach film and the adhesive and partially into the base film.

8. A method as recited in claim 1 wherein the cutting operation does not involve cutting entirely through the base film and wherein the base film is arranged to help hold the singulated dice together after the cutting operation.

9. A method as recited in claim 1 wherein:

the die attach film is attached to a surface of the semiconductor wafer;

the base film is attached to a surface of the support structure;

the adhesive is sandwiched between the die attach film and the base film and helps adhere the die attach film and the base film together.

10. A method as recited in claim 1 wherein the die attach film is selected from the group consisting of a polymer, a glass, a metal and solder paste.

11. A method as recited in claim 1, wherein during the cutting operation a portion of the sawing blade that engages the die attach film is not moving towards the base film.

12. A wafer sawing apparatus as recited in claim 1 wherein:

the sawing blade is circular, is arranged to spin in place and is further arranged not to substantially change its position relative to the support structure during the cutting operation; and the moving of the support structure causes additional, uncut portions of the die attach film and adhesive to be engaged by the sawing blade.

* * * * *